(12) United States Patent
Hegazy et al.

(10) Patent No.: US 9,171,109 B2
(45) Date of Patent: Oct. 27, 2015

(54) METHOD TO COUPLE FLUID-FLOW AND GEOMECHANICAL MODELS FOR INTEGRATED PETROLEUM SYSTEMS USING KNOWN TRIGGERING EVENTS

(71) Applicants: International Business Machines Corporation, Armonk, NY (US); Repsol S A, Madrid (ES)

(72) Inventors: Mohamed Ahmed Hegazy, Madrid (ES); Mookanahallipatna Ramasesha Lakshmikantha, Madrid (ES); Jose Maria Segura Serra, Cardona (ES); Ulisses T. Mello, Blauvelt, NY (US); Eduardo Rocha Rodrigues, Rio de Janeiro (BR); Paula Aida Sesini, Rio de Janeiro (BR)

(73) Assignees: International Business Machines Corporation, Armonk, NY (US); RESOL S A, Madrid (ES)

( * ) Notice: Subject to any disclaimer, the term of this patent is extended or adjusted under 35 U.S.C. 154(b) by 376 days.

(21) Appl. No.: 13/715,479

(22) Filed: Dec. 14, 2012

(65) Prior Publication Data
US 2014/0136163 A1     May 15, 2014

Related U.S. Application Data

(60) Provisional application No. 61/724,616, filed on Nov. 9, 2012.

(51) Int. Cl.
*G06F 17/50* (2006.01)
*G01V 99/00* (2009.01)
(52) U.S. Cl.
CPC .......... *G06F 17/5009* (2013.01); *G01V 99/005* (2013.01)

(58) Field of Classification Search
USPC .......................................................... 703/2, 6
See application file for complete search history.

(56) References Cited

U.S. PATENT DOCUMENTS

| 7,603,265 | B2 | 10/2009 | Mainguy et al. |
| 2009/0125280 | A1 | 5/2009 | Soliman et al. |

(Continued)

FOREIGN PATENT DOCUMENTS

| WO | 2009/029133 A1 | 3/2009 |
| WO | 2010/039566 A1 | 4/2010 |
| WO | 2012/079009 A2 | 6/2012 |

OTHER PUBLICATIONS

Zoback, M.D., et al. "Determination of stress orientation and magnitude in deep wells", International Journal of Rock Mechanics & Mining Sciences 40, accepted Jul. 2003, 1049-1076.

(Continued)

*Primary Examiner* — Thai Phan
(74) *Attorney, Agent, or Firm* — Scully, Scott, Murphy & Presser, P.C.; Louis J. Percello, Esq.

(57) ABSTRACT

Coupling fluid-flow model and geomechanical model for integrated petroleum systems, in one aspect, may comprise analyzing historical data associated with a reservoir to determine one or more triggering events that trigger abrupt changes in the state of stress of the reservoir solid framework and in the pore pressure. One or more time steps are defined based on the determined triggering events. The fluid-flow model and the geomechanical model are coupled at the one or more defined time steps, e.g., one-way or two-way. Number of iterations may be calculated automatically for the two-way coupling to converge.

25 Claims, 9 Drawing Sheets

(56) References Cited

U.S. PATENT DOCUMENTS

| | | |
|---|---|---|
| 2010/0076738 A1 | 3/2010 | Dean et al. |
| 2010/0088076 A1 | 4/2010 | Koutsabeloulis et al. |
| 2010/0191511 A1 | 7/2010 | Hsu et al. |
| 2010/0250206 A1 | 9/2010 | Yogeswaren |
| 2011/0029293 A1 | 2/2011 | Petty et al. |
| 2011/0077918 A1 | 3/2011 | Mutlu et al. |
| 2011/0246159 A1 | 10/2011 | Herwanger et al. |

OTHER PUBLICATIONS

Minkoff, S. E., et al., "Coupled fluid flow and geomechanical deformation modeling", Journal of Petroleum Science and Engineering 38, accepted Feb. 2003, 37-56.

Kim, J., "Sequential Methods for Coupled Geomechanics and Multiphase Flow", Thesis, Feb. 2010.

Settari, A., et al., Advances in Coupled Geomechanical and Reservoir Modeling with Applications to Reservoir Compaction, SPE Journal, Feb. 14-17, 1999, pp. 345-357.

Dean, R.H. et al., A Comparison of Techniques for Coupling Porous Flow and Geomechanics, SPE Journal, Mar. 2006, pp. 132-140.

Schutjens, P. M. et al., "Productions-induced stress change in and above reservoir pierced by two salt domes: Geomechanical modeling and its applications" SPE Europec/EAGE Annual Conference and Exhibition (Jan. 1, 2010) pp. 80-97.

Hustedt, B. et al., "Induced Fracturing in Reservoir Simulations: Application of a New Coupled Simulator to Waterflooding Field Examples" Proceedings of SPE Annual Technical Conference and Exhibition (Jan. 1, 2006) pp. 1-16.

Hustedt, B. et al., "Integrated Data Analysis and Dynamic Fracture Modeling Key to Understanding Complex Waterfloods: Case Study of the Pierce Field, North Sea" SPE Reservoir Evaluation & Engineering (Feb. 1, 2010) pp. 82-94.

Hustedt, B. et al., "Integrated data analysis combined with coupled fracture-reservoir simulations key to understand complex waterflood response" International Petroleum Technology Conference (Jan. 1, 2008) pp. 1-17.

Settari, A. et al., "Numerical Techniques Used for Predicting Subsidence Due to Gas Extraction in the North Adriatic Sea" Petroleum Science and Technology (Jan. 1, 2008) pp. 1205-1223, vol. 26, No. 10-11.

Nikolinakou, M.A. et al., "Geomechanical modeling of stresses and pore pressures in mudstones adjacent to salt bodies" ARMA (Jun. 26, 2011) pp. 1-8.

International Search Report dated Jul. 24, 2014 issued in corresponding International Publication No. WO 2014/072445 A3.

METHOD TO COUPLE FLUID-FLOW AND GEOMECHANICAL MODELS FOR INTEGRATED PETROLEUM SYSTEMS USING KNOWN TRIGGERING EVENTS

CROSS-REFERENCE TO RELATED APPLICATION

This application claims the benefit of U.S. Provisional Application No. 61/724,616 filed on Nov. 9, 2012, the entire content and disclosure of which is incorporated herein by reference.

FIELD

The present application relates generally to natural resource management, and more particularly fluid-flow and geomechanical models for integrated petroleum systems and simulation.

BACKGROUND

Many petroleum field management situations require the knowledge of in-situ reservoir stresses and its evolution during the production life cycle of reservoirs. For example, in cases that there are pre-existing natural fracture networks, changes in the stress field may induce more or less production along some fracture directions, affecting the decisions on well placement and injection production strategies. Other important engineering considerations can be affected by compaction and subsidence in the reservoir and overburden. Geomechanical simulations are used to calculate the mechanical response of the reservoir rocks associated with fluids production or injection into underground formations. These simulations are used to make decisions during the reservoir management life-cycle. It is important to consider the effects of pre-existing fracture networks and faulting in the oil and gas production in conventional and unconventional reservoirs.

In order to simulate the geomechanical behavior of reservoirs, the modeling of both fluid flow and mechanical response are necessary to provide realistic results about the fully coupled behavior of reservoirs under production. The coupling is needed because the state of stress and deformation of the solid framework depend on the fluid pressure within the reservoir. This defines two different physical problems, in which both the physics of fluid and solid phases must be solved simultaneously. Therefore, the mathematical model to be solved is composed by two systems of partial differential equations governing the solid framework state of stress and pressure of the fluid and phases, respectively. The result of the fluid problem is used to solve the solid problem and, in its turn, the result of the solid problem is used to solve the fluid problem. After the partial differential equations of these problems are discretized, a numerical coupling scheme has to be used to enforce this interdependency. Known solutions use coupling schemes based on numerical convergence criteria only.

To solve the coupled fluid-mechanical system problem, different coupling strategies can be employed. The most commonly used schemes are: (1) fully coupling; (2) sequentially iterative coupling; (3) iterative coupling; (4) loosely coupling; (5) loosely staggered in time coupling scheme; and (6) explicit one way coupling. In the fully coupling scheme, the coupled governing equations of flow and geomechanics are solved simultaneously at every time step of the numerical solution. In the sequentially iterative coupling scheme, one problem is solved first, say fluid, and the other problem is solved using the intermediate solution result to iterate at every time step until the full solution converges. In the loosely coupling scheme, the two separate sets of equations are solved independently and information is passed at designated time intervals in both directions. In the loosely staggered in time coupling scheme, the total time step designated for the mechanics simulator is divided into multiple time steps for the flow simulator. At the end of the time interval the pore pressure is passed to the geomechanics simulator. In the explicit one way coupling, the two separate sets of equations are solved independently over the same total time interval and information is updated in only one direction, i.e., from flow simulator to the geomechanics simulator. Normally the points of coupling are based on convergence criteria.

BRIEF SUMMARY

A method to couple fluid-flow model and geomechanical model for integrated petroleum systems, in one aspect, may comprise analyzing historical data associated with a reservoir to determine one or more triggering events that trigger abrupt changes in the state of stress of the reservoir solid framework and in the pore pressure. The method may further comprise defining one or more time steps based on the determined triggering events. The method may also comprise coupling the fluid-flow model and the geomechanical model at the one or more defined time steps. The method may also comprise calculating automatically a number of iterations for the coupling to converge.

A system to couple fluid-flow model and geomechanical model for integrated petroleum systems, in one aspect, may comprise a smart trigger interface operable to execute on a processor. The smart trigger interface may be further operable to determine one or more triggering events that trigger abrupt changes exceeding a change threshold in state of stress of a reservoir solid framework and in pore pressure. The smart trigger interface may be further operable to define one or more time steps based on the determined triggering events. The smart trigger interface may be further operable to cause coupling of the fluid-flow model and the geomechanical model at the one or more defined time steps. The smart trigger interface may be further operable to calculate automatically a number of iterations for the coupling to converge.

A computer readable storage medium storing a program of instructions executable by a machine to perform one or more methods described herein also may be provided.

Further features as well as the structure and operation of various embodiments are described in detail below with reference to the accompanying drawings. In the drawings, like reference numbers indicate identical or functionally similar elements.

DETAILED DESCRIPTION

Figure 1:
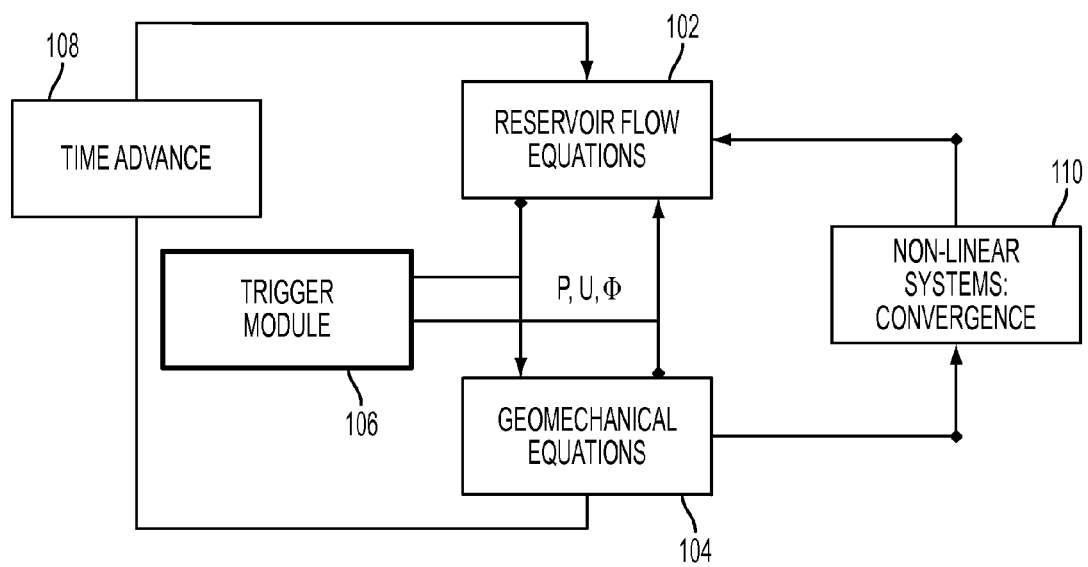
FIG. 1 is a diagram showing smart trigger coupling between the reservoir fluid flow and the geomechanical simulator in one embodiment of the present disclosure.

FIG. 1 is a component diagram showing an overview of a smart trigger coupling between the reservoir fluid flow and the geomechanical simulator in one embodiment of the present disclosure. A novel approach is disclosed that uses known trigger events in the history of a reservoir to define to key points in which the coupling should be tightly coupled. This is an effective way to use the history of reservoir conditions to decrease the computational cost for the execution of coupled geomechanical simulations. The reservoir flow equations 102 compose the fluid flow model that simulates the fluid flow. The geomechanical equations 104 constitute the geomechanical model that simulates the mechanical response of the reservoir rocks.

A trigger module or interface or sensor 106 determines time steps, at which the coupling between the reservoir flow equations 102 and geomechanical equations 104 should occur. Time advance module 108 advances time steps in the simulation of the two models 102 and 104. A convergence module 110 determines a point of convergence between the solutions of the reservoir flow equations 102 and the geomechanical equations 104.

Figure 2:
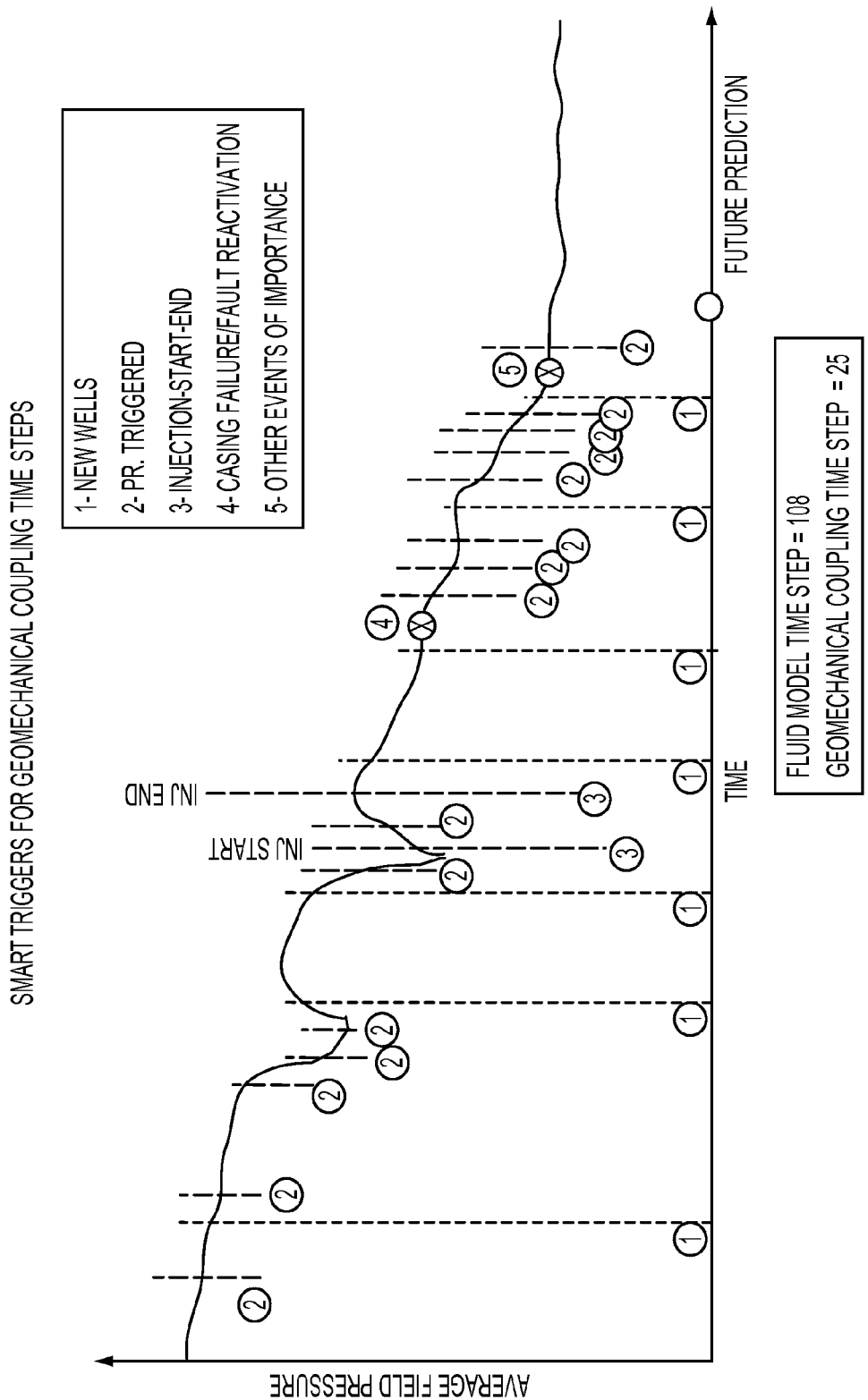
FIG. 2 shows schematics of the average fluid pressure of a reservoir as oil, water, and gas is produced and represented trigger events in one embodiment of the present disclosure.

A novel coupling scheme in one embodiment takes into account the history of triggering event in the reservoir dynamics. The time scale of reservoir deformations also tends to be much larger than the time scale for fluid flow changes. Normally, the changes in state of stress in a reservoir are smooth and gradual during production until a man-made field development or another geological event takes place. These events can trigger abrupt changes in the state of stress of the reservoir solid framework and in the pore pressure. FIG. 2 shows typical changes in the fluid pressure behavior associated with some of these triggering events. A coupling methodology in one embodiment of the present disclosure may utilize a tighter coupling when changes are significant, for instance, as determined based on a criterion or threshold. For example, pressure changes are significant in the valleys of FIG. 2 and they are caused during the process of well injection between the start and the end of the fluid injection.

Figure 9:
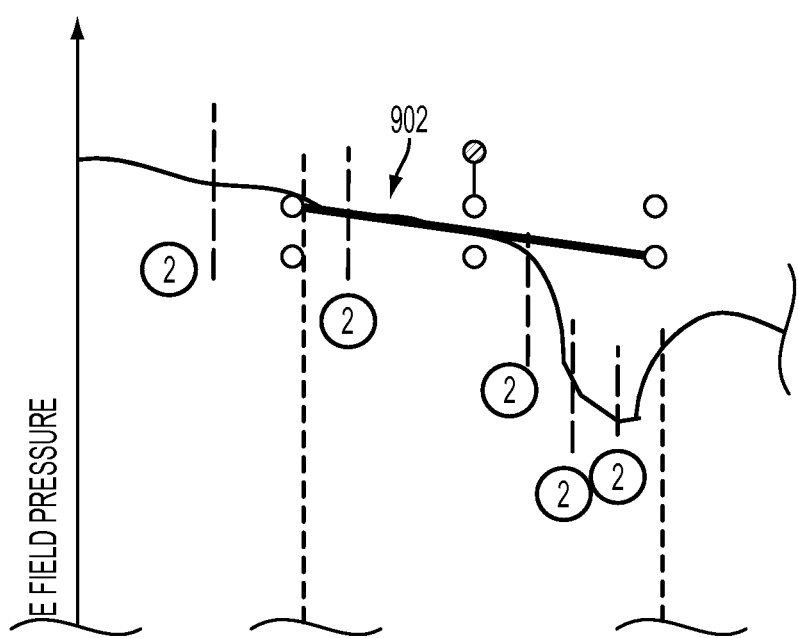
FIG. 9 illustrates definition of a criterion to decide when the pressure change associated with a given well is significant.

The criterion to decide when the change is significant in one embodiment of the present disclosure is based on the estimate of the expected change based on past behavior. For example, referring to FIG. 9, the solid line 902 may be marked which indicates the expected pressure value for the next time step using the Taylor series, which allows for calculating an error based on this prediction and the observed value. FIG. 9 illustrates definition of a criterion to decide when the pressure change for a given well (reservoir) is significant. One of ways to define this error(e) is:

$$e = p_{n+1} - \tilde{p}_{n+1} \quad (1)$$

where $p_{n+1}$ is the measured pressure at a given well in the time n+1 and $\tilde{p}_{n+1}$ is the estimated pressure field using the Taylor series:

$$\tilde{p}_{n+1} = \quad (2)$$

$$p(t_n + \Delta t) = p(t_n) + p'(t)\Delta t + \frac{p''(t)}{2}\Delta t^2 + \frac{p'''(t)}{6}\Delta t^3 + \frac{p''''(t)}{24}\Delta t^4 + O(\Delta t^5)$$

That can be simplified to the equation below where the index n represents the current time step:

$$\tilde{p}_{n+1} = p_n + \Delta t p'_n + \frac{\Delta t^2}{2} p''_n + \frac{\Delta t^2}{2} p'''_n + \frac{\Delta t^3}{6} p''''_n + \frac{\Delta t^4}{24} p''''_n + O(\Delta t^5) \quad (3)$$

where the derivatives $^N p_n$ with N=', ", "', "" are given by the backward finite-difference formulation as follows:

$$p'_n = \frac{1}{\Delta t}(p_n - p_{n-1}) + O(\Delta t) \quad (4)$$

$$p''_n = \frac{1}{\Delta t}(p'_n - p'_{n-1}) + O(\Delta t) \quad (5)$$

$$p'''_n = \frac{1}{\Delta t}(p''_n - p''_{n-1}) + O(\Delta t) \quad (6)$$

$$p''''_n = \frac{1}{\Delta t}(p'''_n - p'''_{n-1}) + O(\Delta t) \quad (7)$$

and the derivatives $^N p_{n-1}$ are also given by the backward finite-difference formulation:

$$p'_{n-1} = \frac{1}{\Delta t}(p_{n-1} - p_{n-2}) + O(\Delta t) \quad (8)$$

$$p''_{n-1} = \frac{1}{\Delta t}(p'_n - p'_{n-1}) + O(\Delta t) \quad (9)$$

$$p'''_{n-1} = \frac{1}{\Delta t}(p''_n - p''_{n-1}) + O(\Delta t) \quad (10)$$

$$p''''_{n-1} = \frac{1}{\Delta t}(p'''_n - p'''_{n-1}) + O(\Delta t) \quad (11)$$

When the error modulus |e| is greater than a tolerance value ($e_{tol}$) given by the user, it is assumed that the pressure change is significant.

The terms O in equations 2-11 represent the big O notation in Taylor series, e.g., an approximation term in the Taylor expansions.

The methodology also takes advantage of relatively small changes in between these event to enforce a loose coupling, given that frequent coupling would not be necessary. Thus, the methodology of the present disclosure in one embodiment is a smart strategy that defines the critical times of coupling and relaxes the coupling when small gradual changes are taking place.

In one embodiment of the methodology of the present disclosure, a high-level interface weakly couples the fluid flow and the geomechanics simulators. The coupling happens at the level of the time step (TS) computing. The total time step designated for the mechanics simulator is divided into multiple time steps for the flow simulator. At the end of the time interval, the pore pressure is passed to the geomechanics simulator for updating its fluid pressure. The fluid pressures is used as loads and they allow the geomechanics simulator to calculate the strains and ultimately the changes of porosity and permeability affected by the strains for the flow simulator's subsequent time steps. This two-way staggered-in-time coupling algorithm proceeds until both simulators reach their final time step.

Sequential solution methods are competitive with the fully coupled approach when numerical stability and convergence behaviors are assured. The results obtained with an iteratively coupled technique are accurate and similar to the results calculated with a fully coupled technique when a tight tolerance is used for the nonlinear iterations.

The loose staggered-in-time coupling of two independent flow and mechanics simulators presented in this disclosure is competitive due to this technique that captures much of the complex physics at a substantially reduced cost. Fully coupled schemes have high development and computational cost. An advantage of the loose coupled technique is that accurate results are achieved with less code development and computational cost than fully coupled techniques. Another advantage of method of the present disclosure is that events that have mechanical significance such as new wells, start of injection, sharp drops and peeks in field pressure and well events (e.g., casing failures), fault reactivation are used to determine the specific times that the coupling should be more tightly enforced. Thus, the approach of the present disclosure allows the coupling to be adaptive and the coupling is tighter at times of known events that occur in the reservoir.

The interface algorithm for the coupling of the flow and geomechanics simulators can be considered a smart coupling in that the methodology can use the information from the defined events to select the time-steps for coupling. In one embodiment of the present disclosure, a methodology may provide the following functions in the coupling interface: the geomechanical stress simulator:

(a) Automatic calculation to define the specific time steps to couple the flow simulator with the geomechanics simulator based on the known triggering events.

In one embodiment of the present disclosure, a method may first define the specific time-steps of coupling using the known events of the reservoir production history. For example, as shown in FIG. 2, historical data indicates that tighter coupling should be enforced in the two pressure drop events represented by the valleys in the pressure. More loosely coupling can be applied in the slow declining plateaus before, after and in between the valleys.

The simulation starts using a time step which is typical of the time scale of the problem (typically in order of days to a month for the fluid flow), the next time steps are calculated using an adaptive time step controlling strategy based on the estimation of the local time integration error with respect to the pressures. The local time integration error within a time interval is defined as the difference of the numerical solution at the end of the time step $p_{n+1}$ and the estimated pressure for a given well using the Taylor series $\tilde{p}_{n+1}$ defined by the equation 2:

$$e = p_{n+1} - \tilde{p}_{n+1} \tag{12}$$

The error norm is related to the difference of the numerical solution between the end and the beginning of the time step:

$$\eta = \|e\|/\|p_{n+1} - p_n\|, v_1\eta_e \leq \eta \leq v_2\eta_e \tag{13}$$

Where $\eta$ is the relative error estimator and $v_1\eta_e$ and $v_2\eta_e$ are the user defined limits.

For $\eta < v_1\eta_e$ the new time will be calculated by the following expression:

$$\Delta t_{new} = \Delta t_{old} \sqrt[2]{\eta_e/\eta} \tag{14}$$

For $\eta > v_2\eta_e$ the old time step is repeated with the new time step size.

(b) Automatic calculation of the number of iterations necessary for the coupling to converge.

The automatic calculation of the number of iterations in one embodiment of the present disclosure is based on the method for convergence for both the pressures and displacements field variables analogous to the ones used in the solution of nonlinear systems using Newton method. For example, the calculation starts estimating a norm $\|\cdot\|$ in $R^N$ of the residue for the fluid pressure $\|R\|_p$ and for the displacement $\|R\|_U$ as follows:

$$\|R\|_p = \frac{\|p^k - p^{k-1}\|}{\|p^{k=0}\|}$$

$$\|R\|_U = \frac{\|U^k - U^{k-1}\|}{\|U^{k=0}\|}$$

Where $p^k$ is the fluid pressure obtained in the k iteration, $p^{k-1}$ is the fluid pressure obtained in the previous iteration k−1 and $U^k$ and $U^{k-1}$ are the displacements in the k and k−1 iterations, respectively.

The norm of the total residue norm $\|R\|$ is calculated as follows:

$$\|R\| = \|R\| + \|R\|$$

And $\eta^k$ is a parameter that specifies the stop criterion for the solution for the iteration k:

$$\eta^k = \gamma \frac{\|R^k\|}{\|R^{k-1}\|}$$

Where $\gamma \in (0,1]$ and the value of the tolerance is defined as follows:

$$\eta^{(k)} = \begin{cases} \eta_{max} & k = 0 \\ \min(\eta_{max}, \eta^{(k)}) & k > 0 \end{cases}$$

Where $\eta_{max}$ can be chosen to be $\eta_{max} = 0.9999$.

In one embodiment, the smart coupling of the present disclosure works using specific events as a trigger to define the specific coupling time steps. The triggers for coupling are specific events that should have coupling on the specific times. In one embodiment of the present disclosure, one or more of the following event are used as trigger events: New wells; Start of fluid injection in wells; Sharp drops and peeks in field pressure (e.g., as determined based on a criterion or threshold, for instance, a drop greater than a first threshold value, a peek greater than a second threshold value); Casing failures in wells; Fault reactivation. Other events, e.g., that are considered to have mechanical impact or significance, may be used.

These triggers are represented in FIG. 2, which describes schematically the average fluid pressure of a reservoir as oil, water, and gas is produced. The trigger events define tighter coupling time steps between fluid and geomechanical simulators. In this figure, the events have the following implication for the geomechanical behavior of the reservoir:

A new production well will start to deplete or decrease the fluid pressure in the reservoir and a tighter coupling is necessary because it causes a local drainage effect and if it cuts through a fracture zone it may create a channel of production.

The start of fluid injection will have the opposite effect of new production well by locally increasing the fluid pressure in adjacent zones to the well. It will also cause changes in the location of the gas-oil and oil-water contacts. The changes of fluid pressure can also induce changes in the stress field causing micro-seismic events in some extreme cases.

In case of heavy oil production, thermal effects are induced by the injection of hot steam changing significantly the flow regime in the reservoir because of localized changes in the properties of the hydrocarbons (e.g., viscosity).

Casing failures can be caused by sediment compaction or fault reactivation that induces differential movement between the rocks and the metal case. This event normally increases the risk of losing the affected well because of lack its integrity.

Observed sharp drops or peaks in the field associated with changes of petrophysical properties (e.g., permeability, porosity) due to changes in the dynamical behavior of the reservoir (e.g., change in the hydrocarbon phase composition and fluid properties).

Other field operational events such as temporary well shutdown, etc.

A methodology of the present disclosure in one embodiment may first define the specific time-steps of coupling using the known events of the reservoir production history. From FIG. 2, it is seen that tighter coupling have to be enforced in the two pressure drop events represented by the valleys in the pressure. More loosely coupling can be applied in the slow declining plateaus before, after and in between the valleys. In one embodiment of the present disclosure, events may be defined that would trigger coupling, e.g., based on the historical data. For example, events are identified or determined, which cause sharp changes in the average field pressure curve over time. During a simulation run, occurrence of those events triggers the coupling of geomechanical and fluid models.

Figure 3:
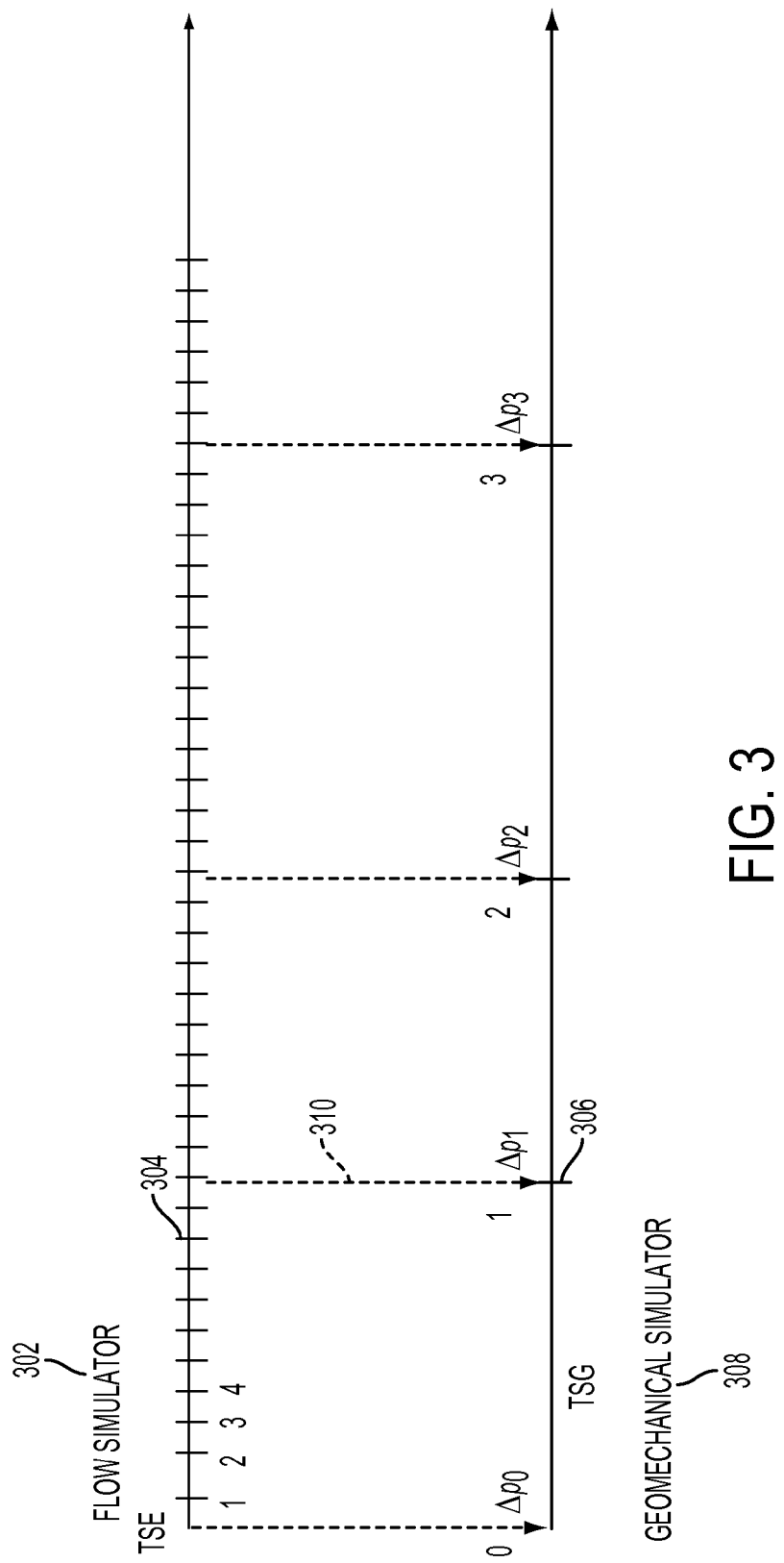
FIG. 3 illustrates a Flow-Geomechanical coupling with loosely coupling staggered scheme at specific triggering events defined by events shown as the vertical arrows in one embodiment of the present disclosure.

FIG. 3 represents the time evolution of the fluid flow simulator 302 on the top with time steps represented by the vertical ticks 304 in red. The black ticks 306 on the bottom represent the time steps for the geomechanical simulator 308. Fluid flow simulation may have much smaller tome steps because of the scale of the fluid flow problem. The vertical cyan lines 310 represent a staggered one-way coupling a specific time steps which are defined by the triggering events. This figure shows an option of coupling in which there is no feedback to the flow simulator. The scheme illustrated in FIG. 3 updates the fluid pressure in the geomechanical simulator at the end of its first time step.

Figure 4:
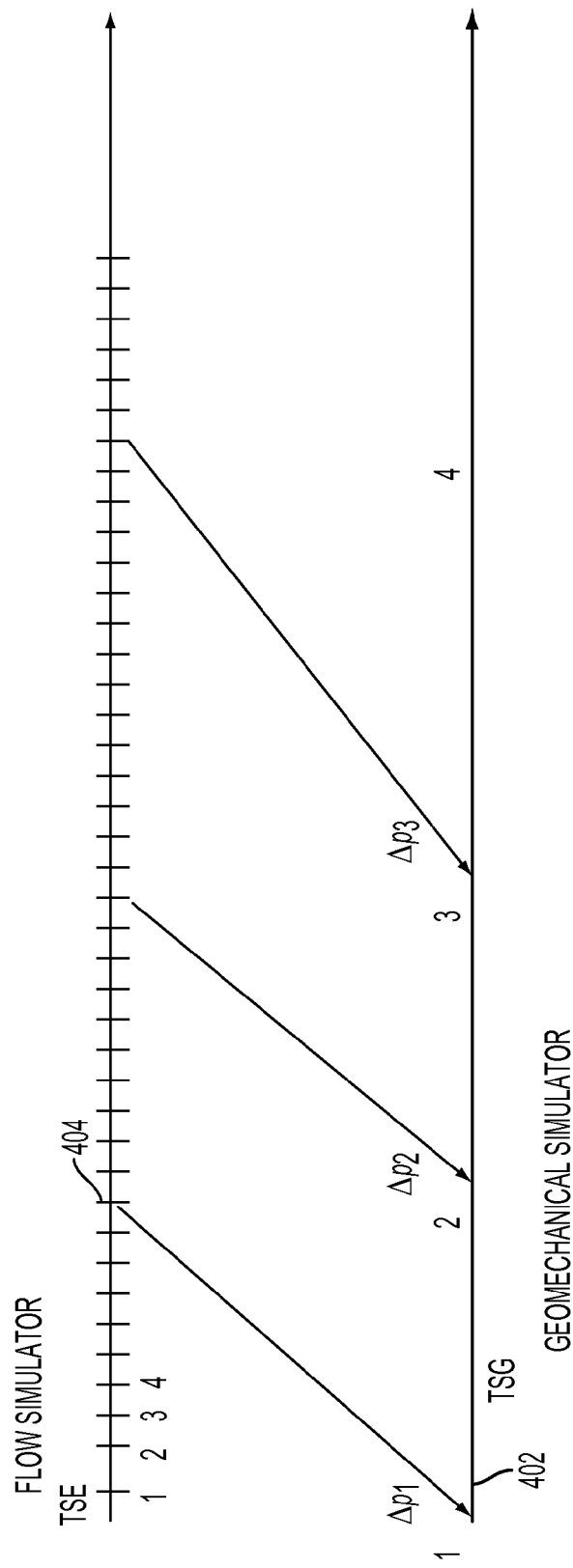
FIG. 4 illustrates a Flow-Geomechanical coupling with loosely coupling staggered scheme in which the fluid pressure of the geomechanical simulator is updated at beginning its time step in one embodiment of the present disclosure.

In another embodiment, the methodology of the present disclosure may update the pressure at the beginning of the geomechanical time step as shown in FIG. 4. FIG. 4 illustrates a Flow-Geomechanical coupling with loosely coupling staggered scheme in which the fluid pressure of the geomechanical simulator is updated at beginning of its time step in one embodiment of the present disclosure. For instance, at the beginning of geomechanical simulator's time step 1 shown at 402, the fluid pressure of the geomechanical simulator uses the data from flow simulator's time step shown at 404.

Figure 5:
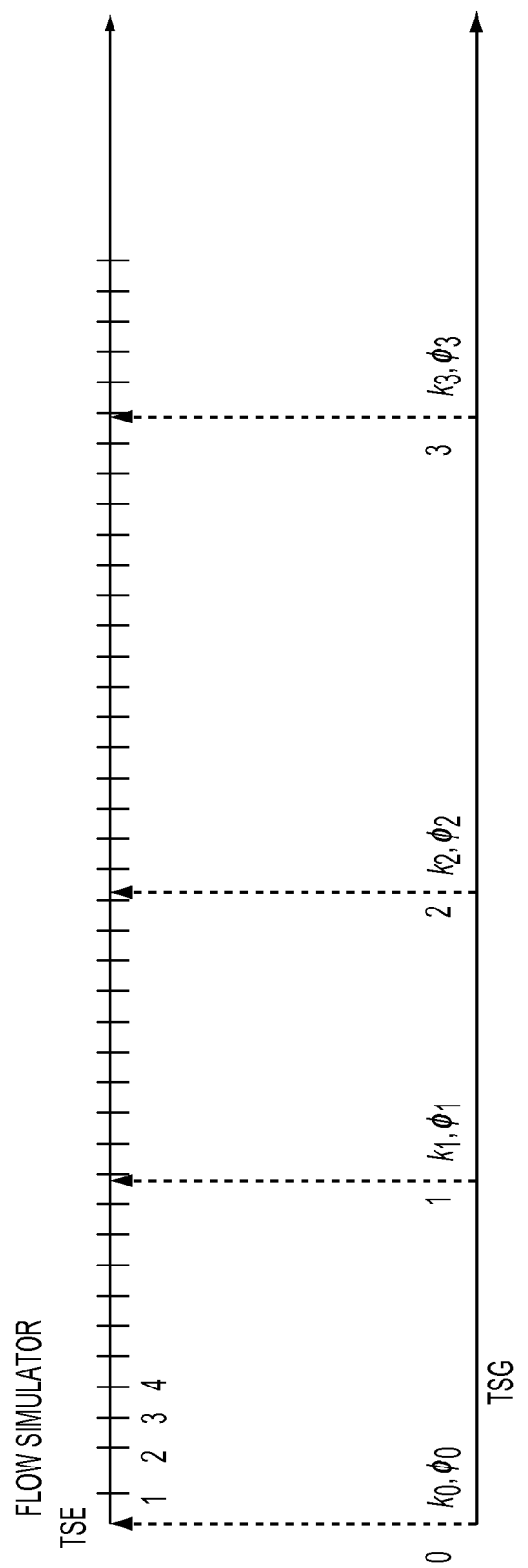
FIG. 5 illustrates a Flow-Geomechanical coupling with loosely one-way coupling staggered scheme with updates from geomechanics simulator in one embodiment of the present disclosure.

FIG. 5 illustrates a Flow-Geomechanical coupling with loosely one-way coupling staggered scheme with updates from geomechanics simulator in one embodiment of the present disclosure. The update scheme shown in this figure may be used to update the petrophysical properties (e.g., permeability, porosity) of the flow simulator from the data of the geomechanical simulator. This is a one way coupling with updates from the geomechanics to the flow simulator in one embodiment of the present disclosure. For instance, parameters $k_1$ and $\phi_1$, $k_2$ and $\phi_2$, $k_3$ and $\phi_3$, . . . represent petrophysical properties (e.g., permeability, porosity) at different time steps.

Figure 6:
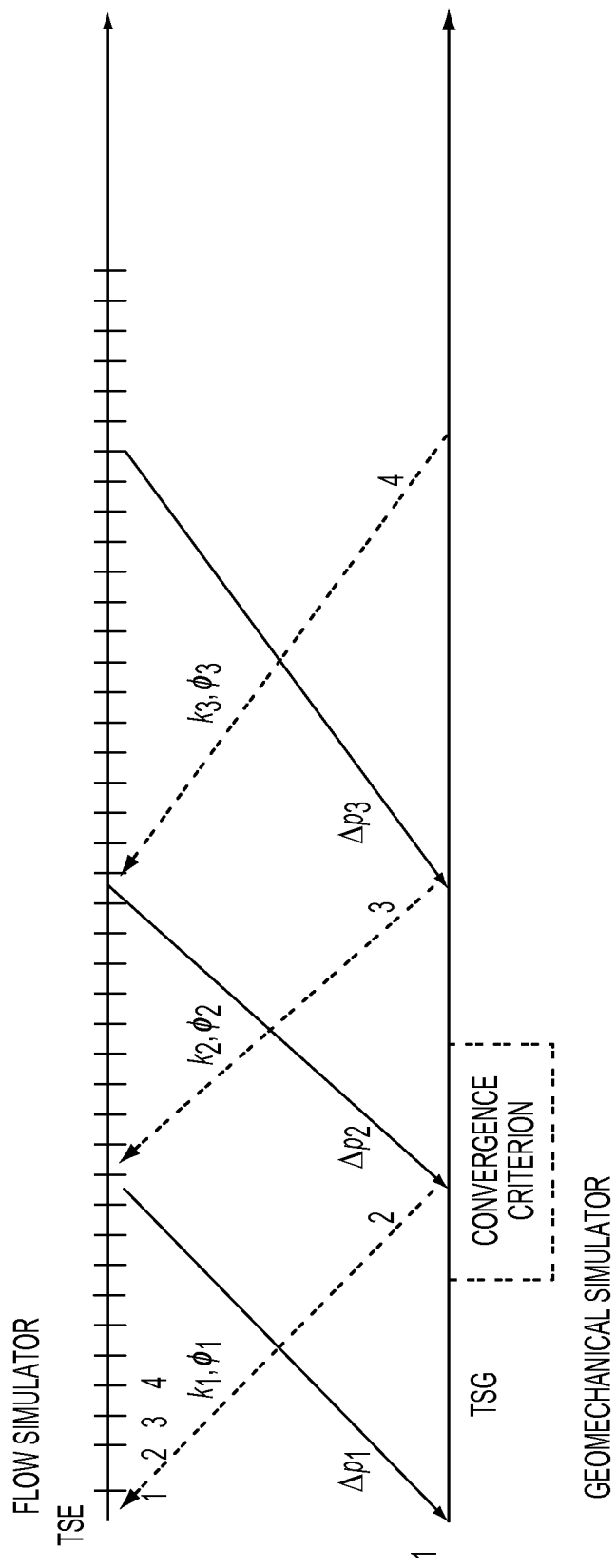
FIG. 6 shows a Flow-Geomechanical coupling with loosely coupling staggered scheme where the geomechanical simulator is updated with pressure from the flow simulator and the flow simulator is updated with petrophysical properties from the geomechanical simulator until a convergence criterion is satisfied in one embodiment of the present disclosure.

FIG. 6 shows a Flow-Geomechanical coupling with loosely coupling staggered scheme where the geomechanical simulator is updated with pressure from the flow simulator and the flow simulator is updated with petrophysical properties from the geomechanical simulator until a convergence criterion is satisfied in one embodiment of the present disclosure. This scheme may be used in a case in which more accuracy is desired or required in the solution. This figure shows two-way coupling being performed until the solution converges. A convergence criterion may be a threshold. For instance, a criterion may check whether the results of the two simulators or models are within a threshold value. For instance, parameters $k_0$ and $\phi_0$, $k_1$ and $\phi_1$, $k_2$ and $\phi_2$, $k_3$ and $\phi_3$, . . . represent petrophysical properties (e.g., permeability, porosity) of the flow simulator at different time steps. Parameters $p_1$, $p_2$, $p_3$ . . . represent pressure at different time steps.

Figure 7:
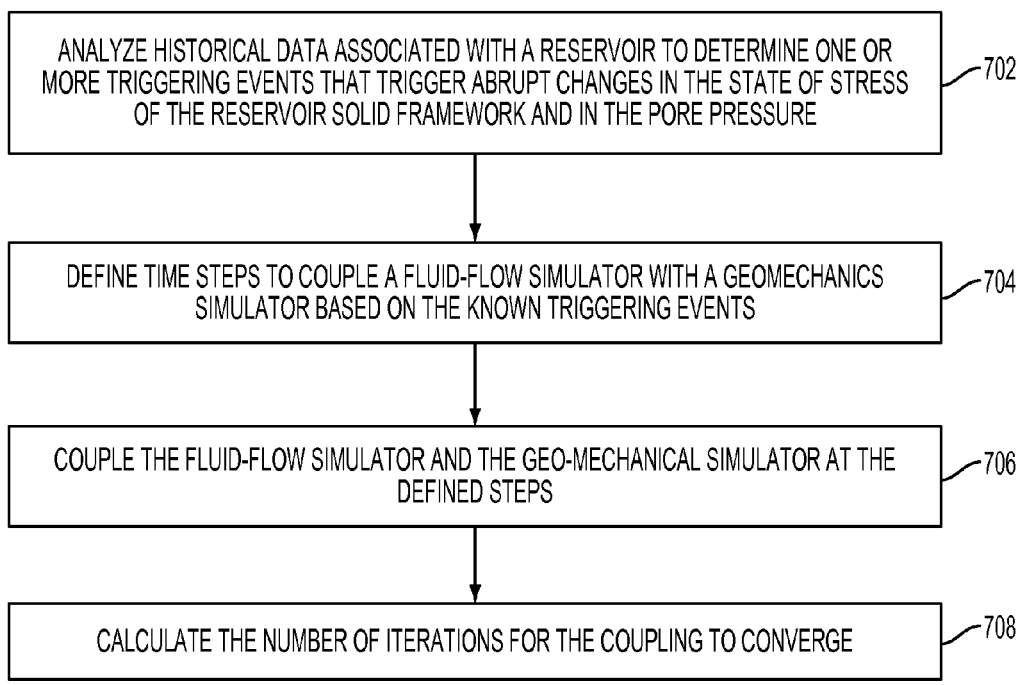
FIG. 7 is a flow diagram illustrating a method of the present disclosure in one embodiment.

FIG. 7 is a flow diagram illustrating a method of the present disclosure in one embodiment. At 702, historical data associated with a reservoir is analyzed to determine one or more triggering events that trigger abrupt changes in the state of stress of the reservoir solid framework and in the pore pressure. For instance, the past triggering events are identified by an analysis of the past pressure history. An automatic method can be used to identify both the past and future abrupt changes using the method described above. If the pressure change is greater than a threshold, e.g., defined by the user (e.g., considered a significant change), this event would trigger the coupling during the simulation.

At 704, time steps are defined at which time to couple a fluid-flow simulator or model with a geomechanical simulator or model based on the determined triggering events. For past events, the time steps can be determined based on the time scale of the changes. Smaller times steps are used when changes are more abrupt. The time steps at which time to couple a fluid-flow simulator with a geomechanical simulator can be defined automatically using the method described above that describes the automatic calculation to define the specific time steps.

At 706, the fluid-flow model and the geomechanical model are coupled at the defined time steps. For example, data computed from the fluid-flow model may be input to the geomechanical model for its computation. When the coupling is one way, only the results computed from one simulator are used as input data for the other simulator. When the coupling is two way, the results calculated with the fluid-flow simulator are used as input for the geomechanical simulator and, in turn, the results computed with the geomechanical simulator are used as input for the fluid-flow simulator. The fluid pressure computed from the fluid-flow simulator is the pore pressure used for the geomechanical simulator as input. The displacements calculated from the geomechanical simulator are used as input for the fluid-flow simulator to compute updates for the new values for the porosity and permeability of the reservoir.

At 708, the number of iterations for the coupling to converge is automatically calculated based on the solutions of the fluid-flow model and the geomechanical model. For example, first the fluid-flow simulator is executed. The fluid pressure field obtained from this simulator is used as input for the geomechanical simulator that is executed in sequence. Then the results of the two simulators (pressures and displacements) are compared with the threshold tolerance defined by the user, e.g., in the way described above in the method to calculate automatically the number of iterations. When the residue estimated is less than or equal the threshold tolerance defined by the user the iteration loop stops and the results obtained from the simulators are used as input for the next time step.

Figure 8:
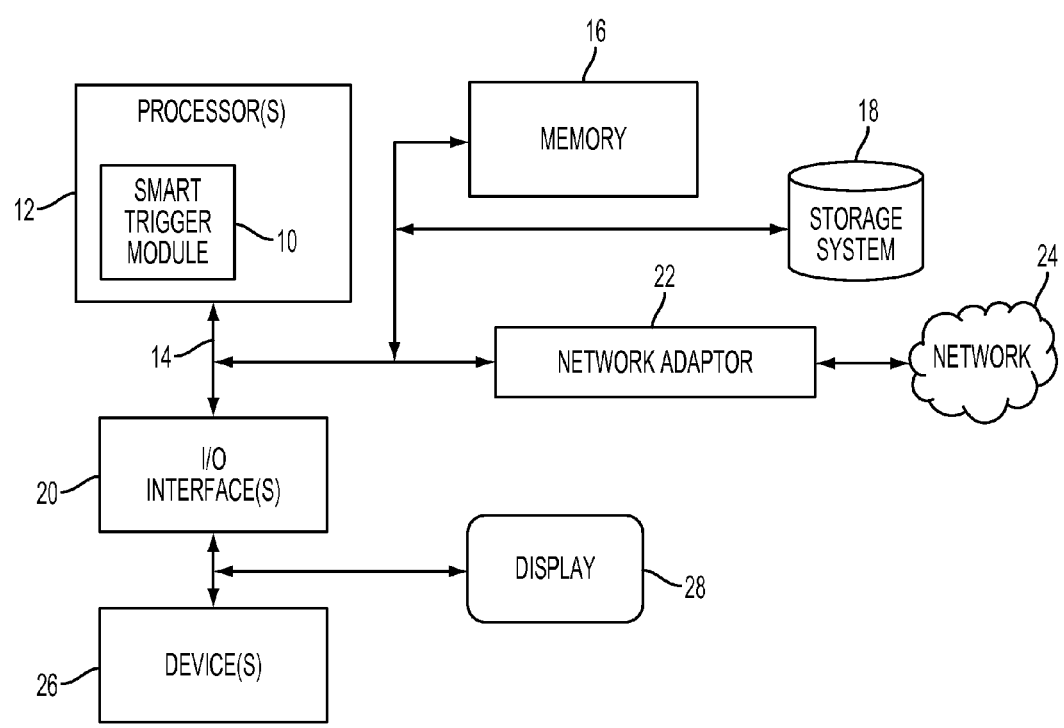
FIG. 8 illustrates a schematic of an example computer or processing system that may implement the smart coupling system in one embodiment of the present disclosure.

FIG. 8 illustrates a schematic of an example computer or processing system that may implement the smart coupling system in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 8 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a smart trigger module 10 that performs the methods described herein. The module 10 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages, a scripting language such as Perl, VBS or similar languages, and/or functional languages such as Lisp and ML and logic-oriented languages such as Prolog. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The computer program product may comprise all the respective features enabling the implementation of the methodology described herein, and which—when loaded in a computer system—is able to carry out the methods. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Various aspects of the present disclosure may be embodied as a program, software, or computer instructions embodied in a computer or machine usable or readable medium, which causes the computer or machine to perform the steps of the method when executed on the computer, processor, and/or machine. A program storage device readable by a machine, tangibly embodying a program of instructions executable by the machine to perform various functionalities and methods described in the present disclosure is also provided.

The system and method of the present disclosure may be implemented and run on a general-purpose computer or special-purpose computer system. The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, and/or server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

We claim:

1. A method to couple fluid-flow model and geomechanical model for integrated petroleum systems, comprising:
   analyzing historical data associated with a reservoir to determine one or more triggering events that trigger abrupt changes in a state of stress of the reservoir solid framework and in pore pressure;
   defining one or more time steps based on the determined triggering events;
   coupling, by a processor, the fluid-flow model and the geomechanical model at the one or more defined time steps; and
   calculating automatically a number of iterations for the coupling to converge.

2. The method of claim 1, wherein the one or more triggering events comprises a new production of a well, start of fluid injections in a well, a drop exceeding a first threshold in field pressure, a peek exceeding a second threshold in field pressure, casing failure in a well, fault reactivation, or combinations thereof.

3. The method of claim 1, wherein the coupling comprises a one way coupling wherein a numerical solution of the fluid-flow model at the defined one or more time steps is passed to the geomechanical model.

4. The method of claim 3, wherein the coupling comprises a one way coupling wherein a numerical solution of the fluid-flow model at the defined one or more time steps is passed to the geomechanical model at an end of the geomechanical model's time step.

5. The method of claim 3, wherein the coupling comprises a one way coupling wherein a numerical solution of the fluid-flow model at the defined one or more time steps is passed to the geomechanical model at a beginning of the geomechanical model's time step.

6. The method of claim 3, wherein the numerical solution of the fluid-flow model provides updates to fluid pressure of the geomechanical model.

7. The method of claim 1, wherein the coupling comprises a one way coupling wherein a numerical solution of the geomechanical model at the defined one or more time steps is passed to the fluid-flow model.

8. The method of claim 7, wherein the numerical solution of the geomechanical model provides updates to one or more petrophysical properties of the fluid-flow model.

9. The method of claim 1, wherein the coupling comprises a two-way coupling wherein a numerical solution of the geomechanical model is passed to the fluid-flow model and a numerical solution of the fluid-flow model is passed to the fluid-flow model at said one or more time steps until a convergence of the numerical solutions is satisfied according to a criterion.

10. The method of claim 9, wherein the geomechanical model is updated with fluid pressure data from the fluid-flow model and the fluid-flow model is updated with petrophysical properties data from the geomechanical model until a convergence criterion is satisfied.

11. A computer readable storage medium storing a program of instructions executable by a machine to perform a method to couple fluid-flow model and geomechanical model for integrated petroleum systems, the method comprising:
    analyzing historical data associated with a reservoir to determine one or more triggering events that trigger abrupt changes in a state of stress of the reservoir solid framework and in pore pressure;
    defining one or more time steps based on the determined triggering events;
    coupling the fluid-flow model and the geomechanical model at the one or more defined time steps; and
    calculating automatically a number of iterations for the coupling to converge.

12. The computer readable storage medium of claim 11, wherein the one or more triggering events comprises a new production of a well, start of fluid injections in a well, a drop exceeding a first threshold in field pressure, a peek exceeding a second threshold in field pressure, casing failure in a well, fault reactivation, or combinations thereof.

13. The computer readable storage medium of claim 11, wherein the coupling comprises a one way coupling wherein a numerical solution of the fluid-flow model at the defined one or more time steps is passed to the geomechanical model.

14. The computer readable storage medium of claim 13, wherein the coupling comprises a one way coupling wherein a numerical solution of the fluid-flow model at the defined one or more time steps is passed to the geomechanical model at an end of the geomechanical model's time step.

15. The computer readable storage medium of claim 13, wherein the coupling comprises a one way coupling wherein a numerical solution of the fluid-flow model at the defined one or more time steps is passed to the geomechanical model at a beginning of the geomechanical model's time step.

16. The computer readable storage medium of claim 13, wherein the numerical solution of the fluid-flow model provides updates to fluid pressure of the geomechanical model.

17. The computer readable storage medium of claim 11, wherein the coupling comprises a one way coupling wherein a numerical solution of the geomechanical model at the defined one or more time steps is passed to the fluid-flow model.

18. The computer readable storage medium of claim 17, wherein the numerical solution of the geomechanical model provides updates to one or more petrophysical properties of the fluid-flow model.

19. The computer readable storage medium of claim 11, wherein the coupling comprises a two-way coupling wherein a numerical solution of the geomechanical model is passed to the fluid-flow model and a numerical solution of the fluid-flow model is passed to the fluid-flow model at said one or more time steps until a convergence of the numerical solutions is satisfied according to a criterion.

20. The computer readable storage medium of claim 19, wherein the geomechanical model is updated with fluid pressure data from the fluid-flow model and the fluid-flow model is updated with petrophysical properties data from the geomechanical model until a convergence criterion is satisfied.

21. A system to couple fluid-flow model and geomechanical model for integrated petroleum systems, comprising:
a processor;
a smart trigger interface operable to execute on the processor, the smart trigger interface further operable to determine one or more triggering events that trigger abrupt changes exceeding a change threshold in state of stress of a reservoir solid framework and in pore pressure, the smart trigger interface further operable to define one or more time steps based on the determined triggering events, the smart trigger interface further operable to cause coupling of the fluid-flow model and the geomechanical model at the one or more defined time steps, the smart trigger interface further operable to calculate automatically a number of iterations for the coupling to converge,
wherein the one or more triggering events comprises a new production of a well, start of fluid injections in a well, a drop exceeding a first threshold in field pressure, a peek exceeding a second threshold in field pressure, casing failure in a well, or fault reactivation, or combinations thereof.

22. The system of claim 21, wherein the coupling comprises:
a one way coupling wherein a numerical solution of the fluid-flow model at the defined one or more time steps is passed to the geomechanical model, wherein the numerical solution of the fluid-flow model provides updates to fluid pressure of the geomechanical model.

23. The system of claim 21, wherein the coupling comprises a one way coupling wherein a numerical solution of the geomechanical model at the defined one or more time steps is passed to the fluid-flow model, wherein the numerical solution of geomechanical model provides updates to one or more petrophysical properties of the fluid-flow model.

24. The system of claim 21, wherein the coupling comprises a two-way coupling wherein a numerical solution of the geomechanical model is passed to the fluid-flow model and a numerical solution of the fluid-flow model is passed to the fluid-flow model at said one or more time steps until a convergence of the numerical solutions is satisfied according to a convergence criterion, wherein the geomechanical model is updated with fluid pressure data from the fluid-flow model and the fluid-flow model is updated with petrophysical properties data from the geomechanical model until the convergence criterion is satisfied.

25. A system to couple fluid-flow model and geomechanical model for integrated petroleum systems, comprising:
a processor;
a reservoir fluid-flow model operable to execute on the processor and simulate fluid flow of a reservoir;
a geomechanical model operable to execute on the processor and simulate mechanical response of rocks of the reservoir;
a trigger sensor operable to execute on the processor and dynamically determine time steps at which the coupling between the reservoir fluid-flow model and geomechanical model is to occur based on occurrence of one or more events, and further causing coupling of the reservoir fluid-flow model and geomechanical model at the determined time steps, the coupling comprising inputting solution of the reservoir fluid-flow model to the geomechanical model, or inputting solution of the geomechanical model to the reservoir fluid-flow model, or combinations thereof; and
a convergence module operable to execute on the processor and determine a point of convergence between solutions of the coupled reservoir fluid-flow model and geomechanical model,
the reservoir fluid-flow model and the geomechanical model coupled at dynamically determined time steps producing realistic fluid flow data and mechanical response data of the reservoir rocks.

* * * * *